US012563780B2

(12) United States Patent
Lin et al.

(10) Patent No.: US 12,563,780 B2
(45) Date of Patent: Feb. 24, 2026

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Shih-Hao Lin, Hsinchu (TW); Chih-Chuan Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 590 days.

(21) Appl. No.: 17/581,632

(22) Filed: Jan. 21, 2022

(65) Prior Publication Data

US 2023/0123484 A1     Apr. 20, 2023

Related U.S. Application Data

(60) Provisional application No. 63/257,227, filed on Oct. 19, 2021.

(51) Int. Cl.
| | |
|---|---|
| *H01L 29/786* | (2006.01) |
| *H10D 30/01* | (2025.01) |
| *H10D 30/67* | (2025.01) |
| *H10D 62/10* | (2025.01) |
| *H10D 62/13* | (2025.01) |
| *H10D 64/01* | (2025.01) |
| *H10D 64/23* | (2025.01) |

(52) U.S. Cl.
CPC ....... *H10D 30/6735* (2025.01); *H10D 30/031* (2025.01); *H10D 30/6757* (2025.01); *H10D 62/118* (2025.01); *H10D 62/151* (2025.01); *H10D 64/018* (2025.01); *H10D 64/258* (2025.01)

(58) Field of Classification Search
CPC ........... H01L 29/42392; H01L 29/0665; H01L 29/0847; H01L 29/41775; H01L 29/66553
USPC ........................................................ 257/401
See application file for complete search history.

(56) References Cited

U.S. PATENT DOCUMENTS

| | | | |
|---|---|---|---|
| 9,754,840 B2 | 9/2017 | Lin et al. | |
| 9,818,872 B2 | 11/2017 | Ching et al. | |
| 9,954,058 B1 * | 4/2018 | Mochizuki | ........ H01L 29/42392 |
| 10,032,627 B2 | 7/2018 | Lee et al. | |

(Continued)

FOREIGN PATENT DOCUMENTS

| | | |
|---|---|---|
| TW | I697121 B | 10/2018 |
| TW | 201921455 A | 6/2019 |
| TW | 202139462 A | 10/2021 |

OTHER PUBLICATIONS

Feng-Ching Chu et al., Expitaxial Features, U.S. Appl. No. 17/321,996, filed May 17, 2021, Assignee: Taiwan Semiconductor Manufacturing Co., Ltd., 31 pages specification, 27 drawings.

*Primary Examiner* — Dzung Tran

(74) *Attorney, Agent, or Firm* — HAYNES AND BOONE, LLP

(57) ABSTRACT

A semiconductor device structure includes nanostructures disposed over a substrate. The structure also includes a gate structure surrounding the nanostructures. The structure also includes inner spacers disposed over opposite sides of the gate structure. The structure also includes source/drain epitaxial structure disposed over opposite sides of the nanostructures. An air gap is disposed between the inner spacers and the source/drain epitaxial structure.

20 Claims, 19 Drawing Sheets

10a

(56)　　　　　　References Cited

U.S. PATENT DOCUMENTS

| | | | |
|---|---|---|---|
| 10,170,638 B1 * | 1/2019 | Reznicek | ............ H01L 29/0649 |
| 10,192,867 B1 * | 1/2019 | Frougier | ......... H01L 21/823828 |
| 10,290,546 B2 | 5/2019 | Chiang et al. | |
| 10,475,902 B2 | 11/2019 | Lee et al. | |
| 10,950,731 B1 | 3/2021 | Peng et al. | |
| 11,031,292 B2 | 6/2021 | Ju et al. | |
| 2017/0317169 A1 * | 11/2017 | Bentley | ............... H01L 29/7848 |
| 2018/0331232 A1 * | 11/2018 | Frougier | ........... H01L 29/78618 |
| 2018/0366544 A1 * | 12/2018 | Chang | ................. H01L 29/7827 |
| 2019/0109052 A1 * | 4/2019 | Reznicek | ........ H01L 21/823431 |
| 2020/0220015 A1 * | 7/2020 | Jang | .................. H01L 29/66795 |
| 2020/0220018 A1 * | 7/2020 | Jang | .................... H01L 29/0847 |
| 2020/0381564 A1 * | 12/2020 | Kang | ................ H01L 29/66545 |
| 2021/0135011 A1 * | 5/2021 | Ju | ...................... H01L 21/31055 |
| 2021/0193829 A1 * | 6/2021 | Reznicek | ............ H01L 29/0847 |
| 2022/0181499 A1 * | 6/2022 | Jung | ................... H01L 29/0673 |

* cited by examiner

10a

10a

10b

10c

10d

10e

SEMICONDUCTOR DEVICE STRUCTURE AND METHOD FOR FORMING THE SAME

CROSS REFERENCE TO RELATED APPLICATIONS

This application claims the benefit of U.S. Provisional Application No. 63/257,227, filed on Oct. 19, 2021, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semi-conductive layers of material over a semiconductor sub-strate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Recently, multi-gate devices have been introduced in an effort to improve gate control by increasing gate-channel coupling, reduce OFF-state current, and reduce short-chan-nel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconduc-tor (CMOS) processes.

However, integration of fabricating of the GAA features around the nanowire can be challenging. While the current methods being employed have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
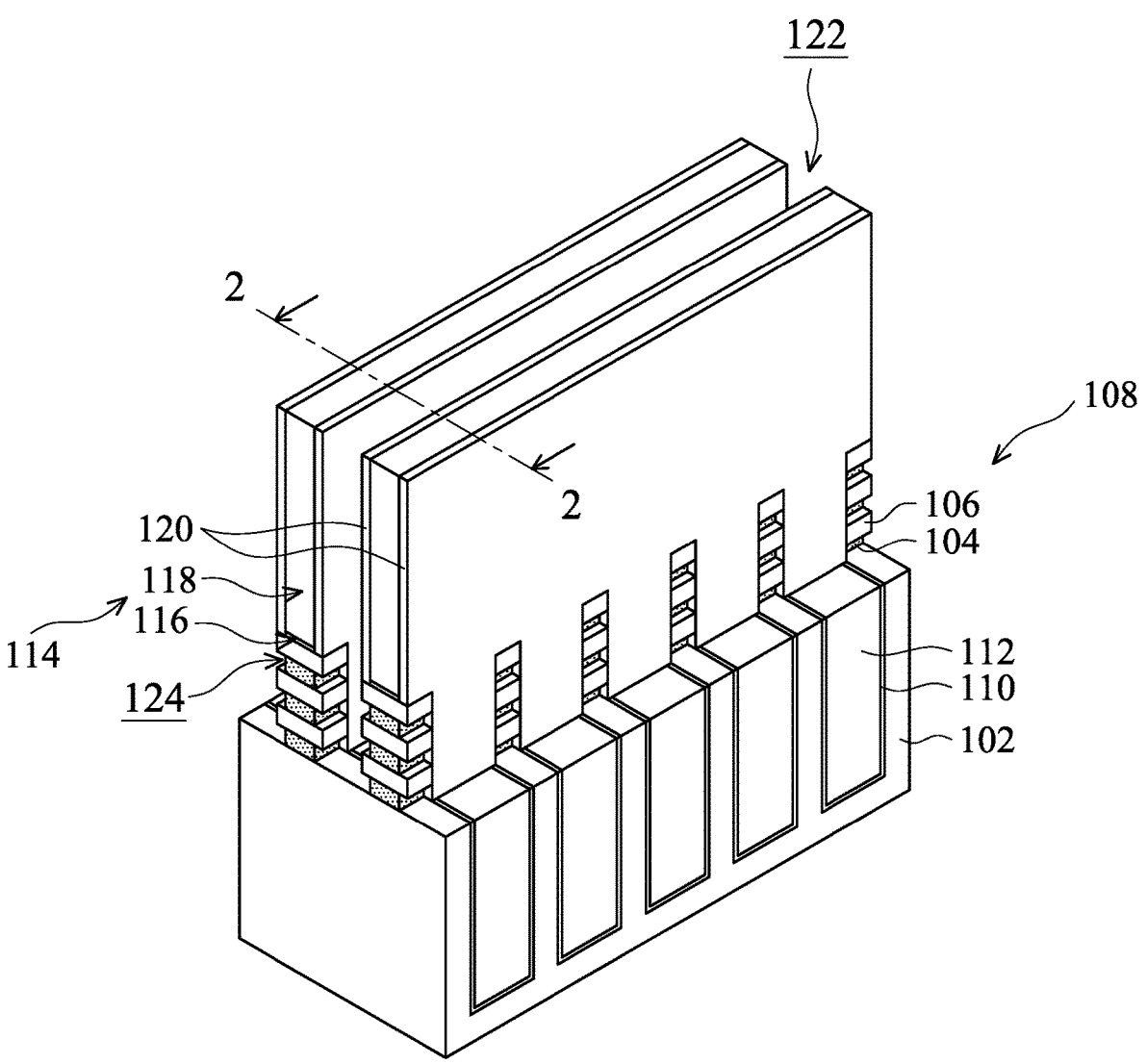
FIG. 1 is a perspective representation of a semiconductor device structure, in accordance with some embodiments of the disclosure.

The following disclosure provides many different embodiments, or examples, for implementing different fea-tures of the subject matter provided. Specific examples of components and arrangements are described below to sim-plify the present disclosure. These are, of course, merely examples and are not intended to be limiting. For example, the formation of a first feature over or on a second feature in the description that follows may include embodiments in which the first and second features are formed in direct contact, and may also include embodiments in which addi-tional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithog-raphy process. Spacers are formed alongside the patterned sacrificial layer using a self-aligned process. The sacrificial layer is then removed, and the remaining spacers may then be used to pattern the GAA structure.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor device struc-ture are provided. The method for forming the semiconduc-tor device structure may include forming an air gap between the inner spacer and the source/drain epitaxial structures. With the air gap, the dopant in the source/drain epitaxial structures may not diffuse out. The uniformity of the thresh-old voltage may be improved. The short channel effect may also be improved and the mobility may be enhanced. In addition, the capacitance may be reduced and the device performance and speed may be improved.

FIG. 1 is a perspective representation of a semiconductor device structure 10a, in accordance with some embodiments of the disclosure. The semiconductor device structure 10a is a gate all around (GAA) transistor structure. FIGS. 2A-2H are cross-sectional representations of various stages of forming the semiconductor device structure 10a, in accordance with some embodiments of the disclosure. FIGS. 2A-2H show cross-sectional representations taken along line 2-2 in FIG. 1.

Figure 2A:
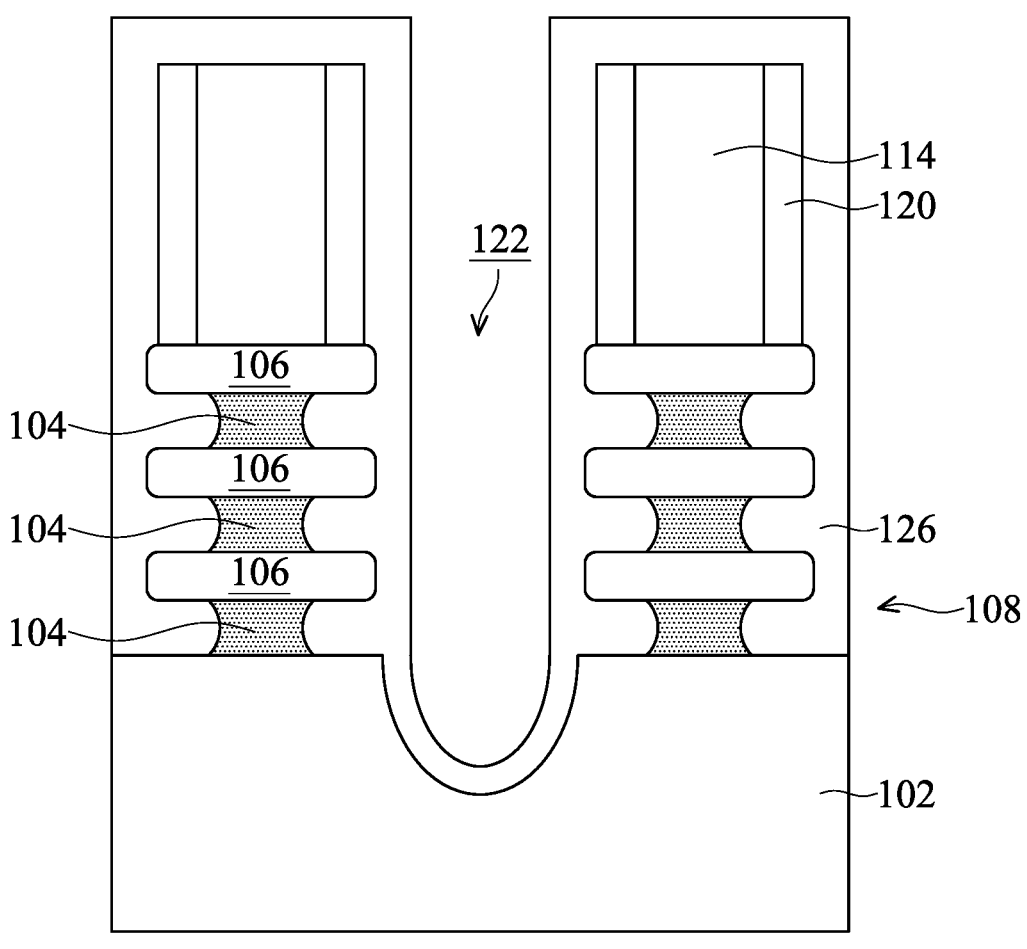
FIGS. 2A-2H are cross-sectional representations of vari-ous stages of forming a semiconductor device structure, in accordance with some embodiments of the disclosure.

A substrate 102 is provided as shown in FIGS. 1 and 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, first semiconductor layers 104 and second semiconductor layers 106 are alternating stacked over the substrate 102. The first semiconductor layers 104 and the second semiconductor layers 106 may include Si, Ge, SiGe, GaAs, InSb, GaP, GaSb, InAlAs, InGaAs, GaSbP, GaAsSb, or InP. The first semiconductor layers 104 and second semiconductor layers 106 may be made of different materials with different etching rates. In some embodiments, the first semiconductor layers 104 include SiGe and the second semiconductor layers 106 include Si.

The first semiconductor layers 104 and second semiconductor layers 106 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of the first semiconductor layers 104 and three layers of the second semiconductor layers 106 shown in FIGS. 1 and 2A, the number of the first semiconductor layers 104 and second semiconductor layers 106 are not limited herein and may vary depending on the demand of performance and process.

Next, a hard mask layer may be formed and patterned over the first semiconductor layers 104 and second semiconductor layers 106 (not shown). The first semiconductor layers 104 and second semiconductor layers 106 may be patterned to form fin structures 108 using the patterned hard mask layer as a mask layer. The patterning process may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

After the fin structures 108 are formed, a liner layer 110 is formed in the trenches between the fin structures 108, as shown in FIG. 1 in accordance with some embodiments. The liner layer 110 may be conformally formed over the substrate 102, the fin structure 108, and the hard mask layer covering the fin structure. The liner layer 110 may be used to protect the fin structure 108 from being damaged in the following processes (such as an anneal process or an etching process). The liner layer 110 may be made of silicon nitride. The liner layer 110 may be formed by using a thermal oxidation, a CVD process, an atomic layer deposition (ALD) process, a LPCVD process, a plasma enhanced CVD (PECVD) process, a HDPCVD process, a flowable CVD (FCVD) process, another applicable process, or a combination thereof.

Next, an isolation structure material 112 may be then filled over the liner layer 110 in the trenches between the fin structures 108. The isolation structure 112 may be made of silicon oxide, silicon nitride, silicon oxynitride, fluoride-doped silicate glass (FSG), or another low-k dielectric material. The isolation structure 112 may be deposited by a deposition process, such as a chemical vapor deposition (CVD) process, a spin-on-glass process, or another applicable process.

Next, an etching process may be performed on the isolation structure 112 and the liner layer 110. The etching process may be used to remove a top portion of the liner layer 110 and a top portion of the isolation structure 112. As a result, the first semiconductor layers 104 and the second semiconductor layers 106 may be exposed and the remaining isolation structure 112 and the liner layer 110 may surround the base portion of the fin structure 108. The remaining isolation structure 112 may be a shallow trench isolation (STI) structure surrounding the base portion of the fin structure 108. The isolation structure 112 may be configured to prevent electrical interference or crosstalk. Therefore, trenches may be formed between the fin structures 108.

Next, a dummy gate structure 114 is formed over and across the fin structures 108, as shown in FIGS. 1 and 2A in accordance with some embodiments. The dummy gate structure 114 may include a dummy gate dielectric layer 116 and a dummy gate electrode layer 118. The dummy gate dielectric layer 116 and the dummy gate electrode layer 118 may be replaced by the following steps to form a real gate structure with a high-k dielectric layer and a metal gate electrode layer.

The dummy gate dielectric layer 116 may include silicon oxide. The silicon oxide may be formed by an oxidation process (e.g., a dry oxidation process, or a wet oxidation process), a chemical vapor deposition process, other applicable processes, or a combination thereof. Alternatively, the dummy gate dielectric layer 116 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, $(Ba, Sr)TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer 118 may include polycrystalline-silicon (poly-Si), poly-crystalline silicon-germanium (poly-SiGe), other applicable materials, or a combination thereof. The dummy gate electrode layer 118 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the dummy gate dielectric layer 116 and the dummy gate electrode layer 118 to form the dummy gate structure 114 by using a patterned photoresist layer as a mask (not shown). The etching process may be a dry etching process or a wet etching process. The dummy gate dielectric layer 116 and a dummy gate electrode layer 118 may be etched by a dry etching process. The dry etching process may include using a fluorine-based etchant gas, such as $SF_6$, $C_xF_y$ (where x and y may be positive integers), $NF_3$, or a combination thereof. After the etching process, the first semiconductor layers 104 and the second semiconductor layers 106 may be exposed on opposite sides of the dummy gate structure 114.

Next, a conformal dielectric layer is deposited over the substrate 102 and the dummy gate structure 114, and then an etching process is performed. A pair of spacer layers 120 is formed on opposite sidewalls of the dummy gate structure 114, and a source/drain opening 122 is formed between adjacent dummy gate structure 114, as shown in FIGS. 1 and 2A in accordance with some embodiments. The spacer layers 120 may be made of silicon oxide, silicon nitride, silicon oxynitride, and/or dielectric materials. The spacer layers 120 may be formed by a chemical vapor deposition (CVD) process, a spin-on-glass process, or another applicable process.

The first semiconductor layers 104 and the second semiconductor layers 106 of the fin structure 108 exposed on opposite sides of the dummy gate structure 114 may be removed in the etching process to form a source/drain opening 122, as shown in FIGS. 1 and 2A in accordance with some embodiments. The etching process may be a dry etching process or a wet etching process. In some embodiments, the fin structures 108 is etched by a dry etching process. The dry etching process may include using a fluorine-based etchant gas, such as $SF_6$, $C_xF_y$ (where x and y may be positive integers), $NF_3$, or a combination thereof.

Next, the first semiconductor layers 104 are laterally etched from the source/drain opening 122 to form recesses 124, as shown in FIG. 1 in accordance with some embodiments. The outer portions of the first semiconductor layers 104 may be removed, and the inner portions of the first semiconductor layers 104 under the dummy gate structures 114 or the spacer layers 120 may remain. The lateral etching of the first semiconductor layers 104 may be a dry etching process, a wet etching process, or a combination thereof. After the lateral etching, the sidewalls of the etched first semiconductor layers 104 may be not aligned with the sidewalls of the second semiconductor layers 106. The etched first semiconductor layers 104 may have straight sidewalls or curved sidewalls, depending on the etching process.

Figure 2B:
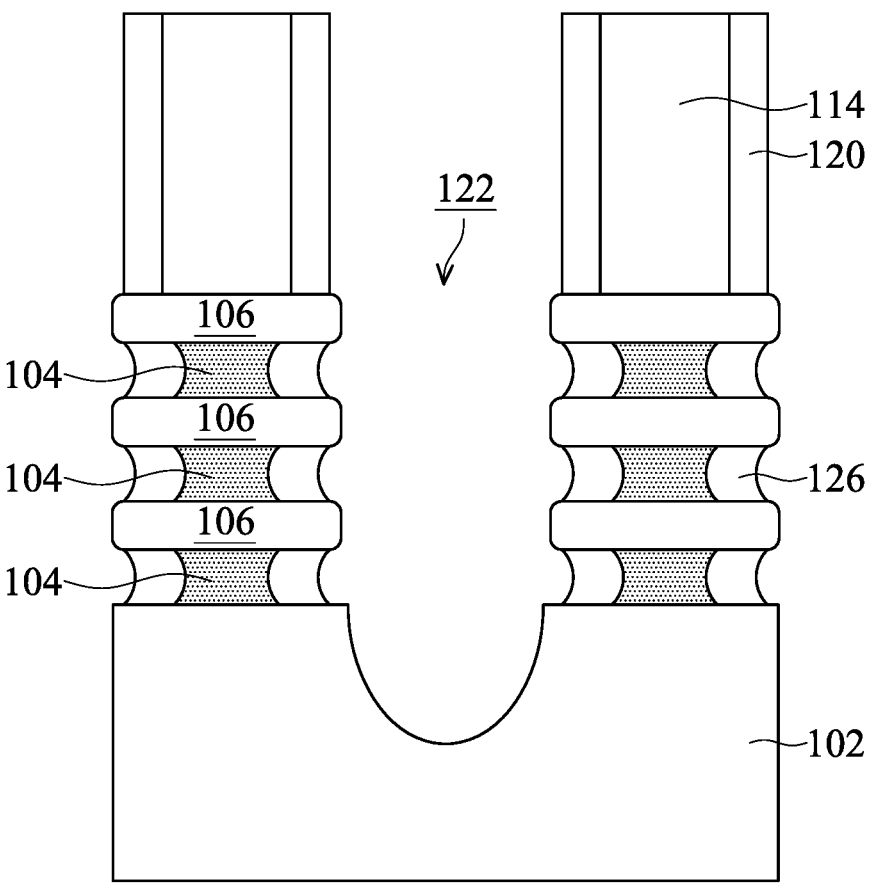

Next, an inner spacer 126 is formed in the recess 124, as shown in FIGS. 2A and 2B in accordance with some embodiments. A inner spacer layer material may be conformally deposited over the substrate 102 and in the recesses 124, as shown in FIG. 2A in accordance with some embodiments. Later, an etched-back process may be performed to remove the excess inner spacer layer material, leaving the inner spacers 126 in the recesses 124, as shown in FIG. 2B in accordance with some embodiments. The inner spacer

126 may provide a barrier between subsequently formed source/drain epitaxial structures and gate structure. The inner spacer 126 may be made of silicon oxide, silicon nitride, silicon carbon nitride (SiCN), silicon oxide carbonitride (SiOCN), or a combination thereof. The inner spacer 126 may be formed by a deposition process. The deposition process may include a CVD process (such as LPCVD, PECVD, SACVD, or FCVD), an ALD process, another applicable method, or a combination thereof.

The sidewall of the inner spacer 126 is laterally trimmed in the etch-back process, as shown in FIG. 2B in accordance with some embodiments. Therefore, the inner spacer 126 has a concave sidewall under the second semiconductor layers 106. The inner spacer 126 may be trimmed by an etch-back process. The etch-back process may include a dry etching process or a wet etching process. In some embodiments, the etch-back process is a dry etching process. The dry etching process may include using a fluorine-based etchant gas, such as $SF_6$, $C_xF_y$ (where x and y may be positive integers), $NF_3$, or a combination thereof. As shown in FIG. 2B, the inner spacers 126 interleave the second semiconductor layers 106.

Figure 2C:
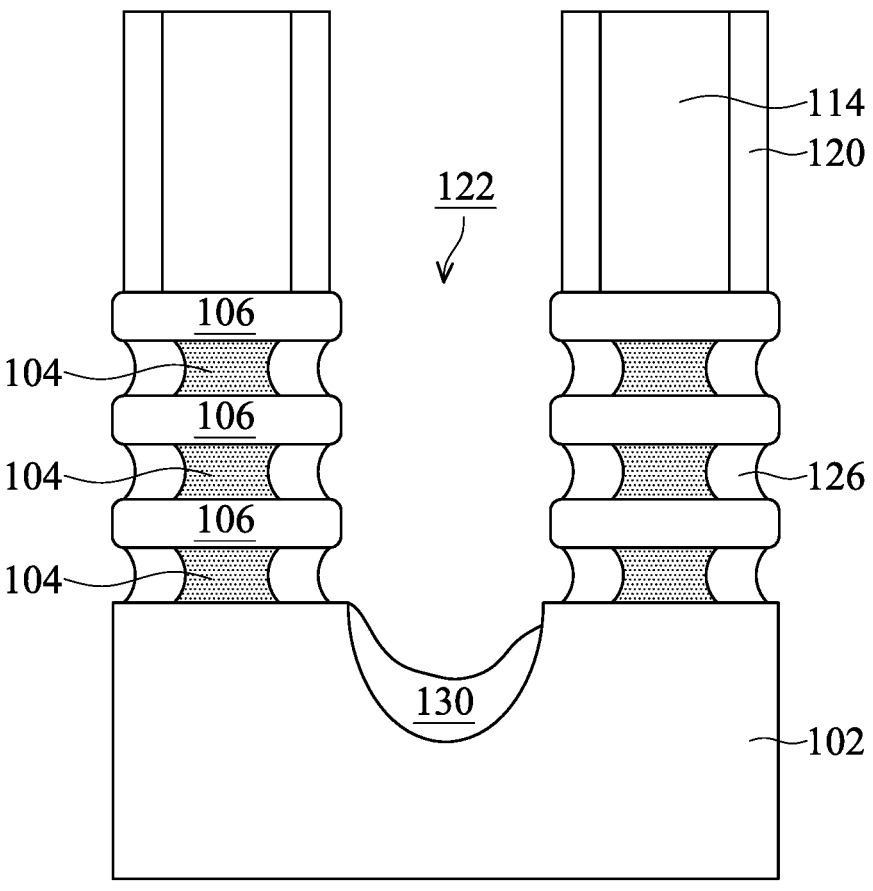

Next, an un-doped layer structure 130 is formed at the bottom of the source/drain opening 122, as shown in FIG. 2C in accordance with some embodiments. In some embodiments, the un-doped layer structure 130 is formed over the substrate 102 beside the fin structure 108. The un-doped layer structure 130 may be made of semiconductor material such as silicon or SiGe. In some embodiments, the un-doped layer structure 130 is made of silicon. The un-doped layer structure 130 may be formed by epitaxially depositing the un-doped layer material and etching back the deposited un-doped layer material. The un-doped layer material may be deposited using an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method. In some embodiments, the un-doped layer structure 130 is formed by silane gas. In some embodiments, the un-doped layer structure 130 does not include dopant.

Figure 2D:
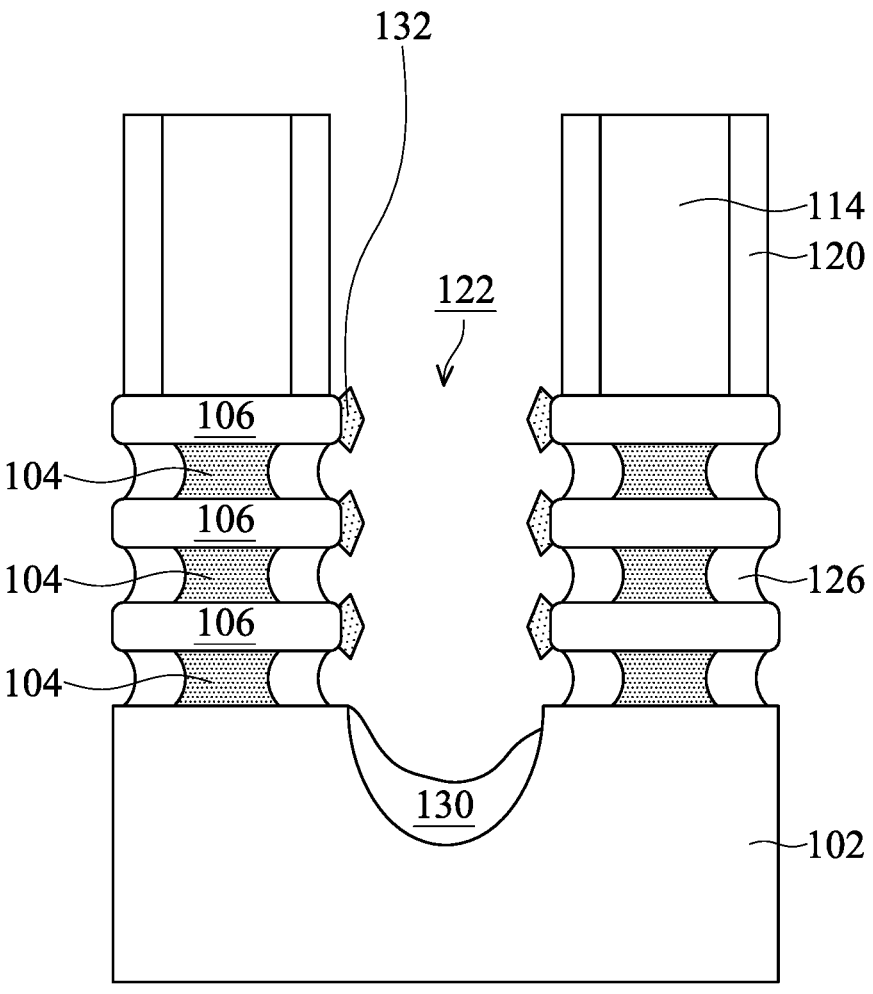

Next, a pre-layer structure 132 is formed over sidewalls of the second semiconductor layers 106, as shown in FIG. 2D in accordance with some embodiments. The pre-layer structure 132 may be formed by a cyclic deposition and etching process that includes multiple deposition cycles and multiple etching cycles. The cyclic deposition and etching process may constrain the material of the pre-layer structure 132 and the shape of the pre-layer structure 132. In some embodiments, the pre-layer structure 132 has a diamond shape. In some embodiments, the pre-layer structure 132 formed over sidewalls of adjacent second semiconductor layers 106 are separate from each other. In some embodiments, the deposition process includes using $SiH_4$ base material, and the etching process includes using HCl and HF. In some embodiments, the etching process includes using HBr, $Cl_2$, and $NF_3$ gas. The cyclic deposition and etching process may be performed under atmospheric pressure.

In some embodiments, the number of cycles in the deposition cycles or the etching cycles is in a range of about 5 cycles to about 10 cycles. In some embodiments, the deposition duration is in a range of about 40 seconds to about 50 seconds, and the etching duration is in a range of about 40 seconds to about 50 seconds in each cycle. The deposition and etching temperature is in a range of about 700° C. to about 800° C. The deposition and etching power may be in a range of about 250 W to about 300 W. The thickness of the pre-layer structure 132 depends on the cycle number, the duration, the temperature, and the power of the deposition and etching process of forming the pre-layer structure 132. If the number of deposition cycles is greater, or the duration, temperature, and power of each deposition cycle is greater, or the duration, temperature, and power of the etching is smaller, the pre-layer structure 132 may be thicker, and the subsequently formed first epitaxial layer structures may be merged earlier. Therefore, the subsequently formed air gap may be too small, and the uniformity of the threshold voltage may be worse. If the number of deposition cycles is smaller, or the duration, temperature, and power of the deposition is smaller, or the duration, temperature, and power of each etching is greater, the pre-layer structure 132 may be thinner, and the subsequently formed first epitaxial layer structures may be merged later. If the pre-layer structure 132 is too thin, the subsequently formed air gap may not be formed, and the subsequently formed second epitaxial layer structure may be in contact with the inner spacer 126. With the pre-layer structure 132 forming by a cyclic deposition and etching process, a thicker pre-layer structure 132 may be formed, and an air gap may be formed between thicker pre-layer structures 132.

The pre-layer structure 132 may be N-type or P-type pre-layer structure 132 and may be in-situ doped with N-type or P-type dopants, respectively. The P-type pre-layer structure 132 may include SiGe. The P-type dopants may be boron, indium, or gallium. The P-type doping precursors may be diborane ($B_2H_6$), boron trifluoride ($BF_3$), other p-type doping precursors, or a combination thereof. In some embodiments, the dopant concentration of the P-type pre-layer structure 132 is in a range of about 2E20 atoms/cm$^3$ to about 7E20 atoms/cm$^3$. If the dopant concentration is too high, the dopant may out-diffuse, resulting in threshold voltage variation, increase of the short channel effect, and reduction of carrier mobility. If the dopant concentration is too low, the parasitic resistance of the resulting device may increase.

The N-type pre-layer structure 132 may include Si, SiP, or SiC. The N-type dopants may be phosphorus or arsenic. The N-type doping precursors such as, but not limited to, phosphine ($PH_3$), arsine ($AsH_3$), other n-type doping precursors, or a combination thereof. In some embodiments, the dopant concentration of the N-type pre-layer structure 132 is in a range of about 5E20 atoms/cm$^3$ to about 1E21 atoms/cm$^3$. If the dopant concentration is greater than 1E21 atoms/cm$^3$, the dopant may diffuse out, resulting in threshold voltage variation, increase of the short channel effect, and reduction of the mobility. If the dopant concentration is too low, the parasitic resistance of the resulting device may increase.

Figure 2E:
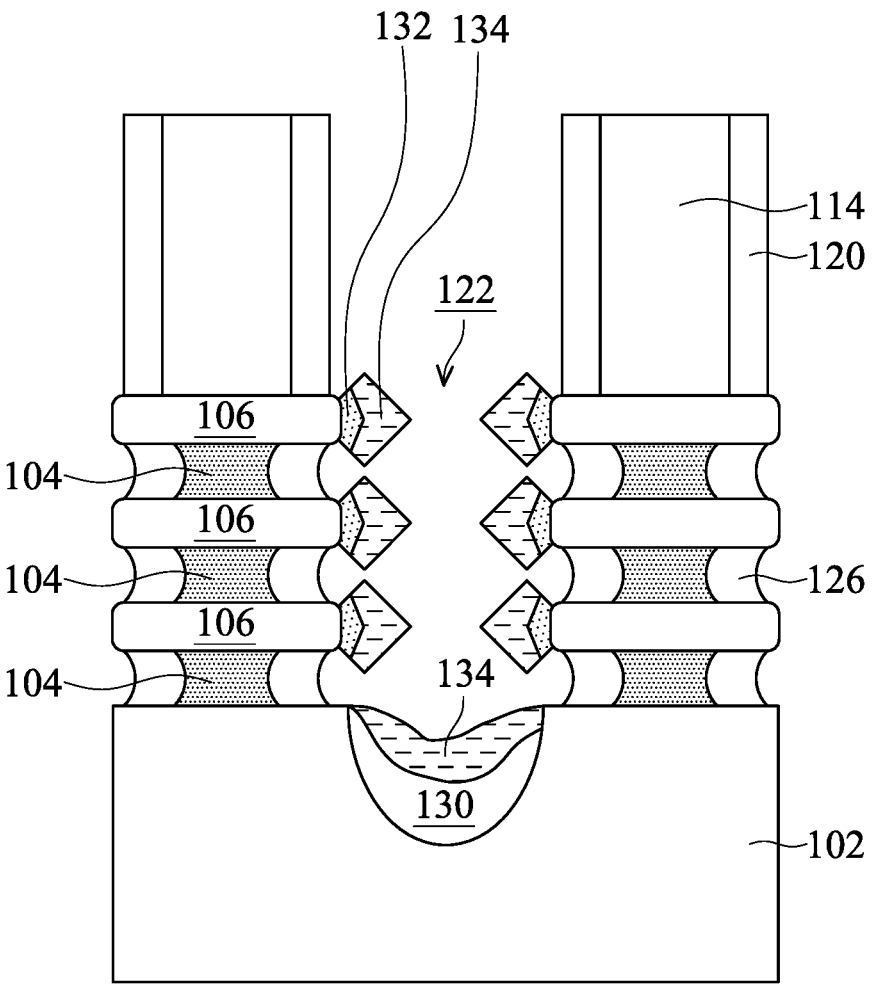

Afterwards, a first epitaxial layer structure 134 is formed over sidewalls of the pre-layer structure 132, as shown in FIG. 2E in accordance with some embodiments. In some embodiments, the first epitaxial layer structure 134 is also formed over the un-doped layer structure 130 at the bottom of the source/drain opening 122. The first epitaxial layer structure 134 may include a strained material. A strained material may be grown over sidewalls of the pre-layer structure 132 by an epitaxial (epi) process to form the first epitaxial layer structure 134. The P-type first epitaxial layer structure 134 may include SiGe, and the N-type first epitaxial layer structure 134 may include SiP. In addition, the lattice constant of the strained material may be different from the lattice constant of the substrate 102 and the second semiconductor layer 106. The first epitaxial layer structure

134 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method. In some embodiments, the pre-layer structure 132 is formed by a cyclical deposition and etching process, while the first epitaxial layer structure 134 is formed by an epitaxial process, without any etching steps.

In some embodiments, since the epitaxy growth rate in the (110) direction is greater than the epitaxy growth rate in the (100) direction, the lateral epitaxy rate of forming the first epitaxial layer structure 134 is greater than the vertical epitaxy rate of forming the first epitaxial layer structure 134. Therefore, the first epitaxial layer structure 134 may have a diamond shape. Since the pre-layer structure 132 is thicker, an air gap may be formed between the diamond shapes of adjacent first epitaxial layer structures 134.

In some embodiments, the dopant concentration of the P-type first epitaxial layer structure 134 is in a range of about 7E20 atoms/cm$^3$ to about 1E21 atoms/cm$^3$. In some embodiments, the dopant concentration of the N-type first epitaxial layer structure 134 is in a range of about 1E21 atoms/cm$^3$ to about 3E21 atoms/cm$^3$. If the dopant concentration is too high, the dopant may diffuse out, resulting in threshold voltage variation, increase of the short channel effect, and reduction of carrier mobility. If the dopant concentration is too low, the parasitic resistance of the resulting device may increase. In some embodiments, the dopant concentration of the first epitaxial layer structure 134 is greater than the dopant concentration of the pre-layer structure 132, and the dopant concentration of the pre-layer structure 132 is greater than the dopant concentration of the un-doped layer structure 130. In this way, dopant out-diffusion may be prevented and the resistance may be lowered.

Figure 2F:
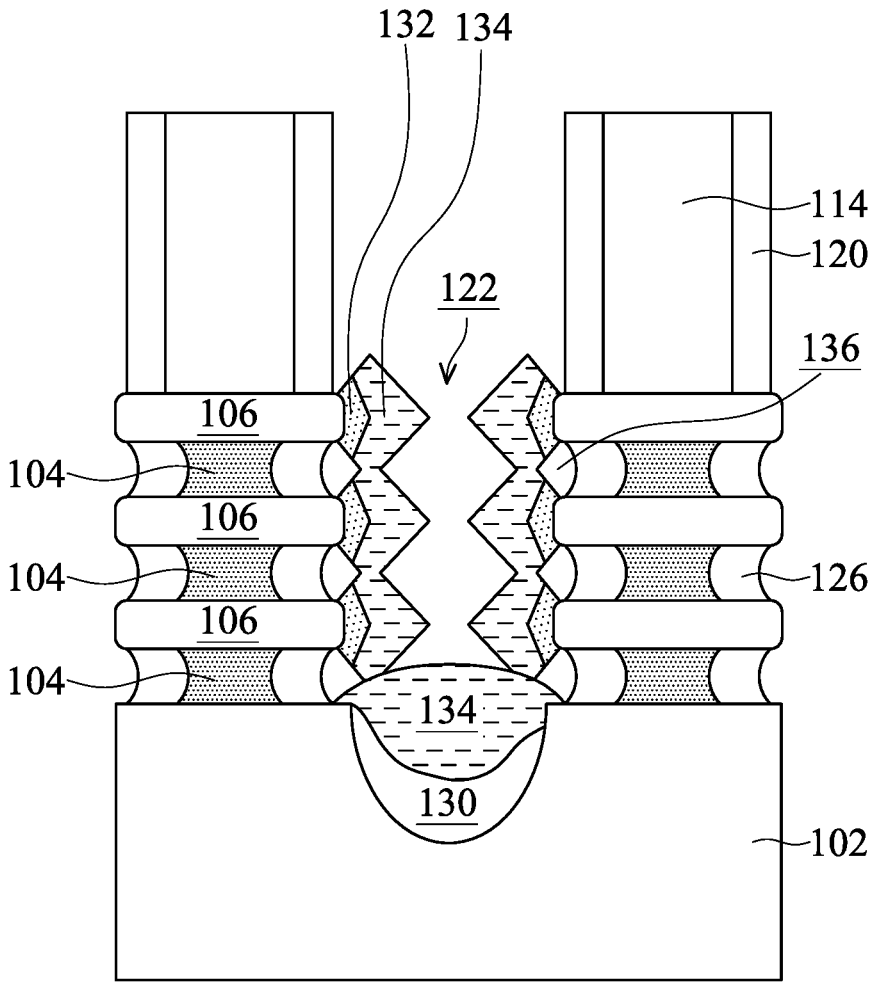

Next, adjacent first epitaxial layer structures 134 are merged and an air gap 136 is formed between the inner spacer 126 and the first epitaxial layer structures 134, as shown in FIG. 2F in accordance with some embodiments. In some embodiments, the air gap 136 is formed between adjacent pre-layer structures 132. In some embodiments, the first epitaxial layer structures 134 are merged in the vertical direction. In some embodiments, adjacent first epitaxial layer structures 134 are in contact with each other. In some embodiments, the inner spacers 126, the pre-layer structure 132, and the first epitaxial layer structure 134 are exposed in the air gap 136.

In some embodiments, the first epitaxial layer structures 134 is also formed over the un-doped layer structure 130 in the source/drain opening 122. In some embodiments, the first epitaxial layer structures 134 over the un-doped layer structure 130 is in contact with the bottommost first epitaxial layer structures 134 over the sidewalls of the pre-layer structure 132, and an air gap 136 is formed between the first epitaxial layer structures 134 over the un-doped layer structure 130 and the bottommost first epitaxial layer structures 134 over the sidewalls of the pre-layer structure 132.

Figure 2G:
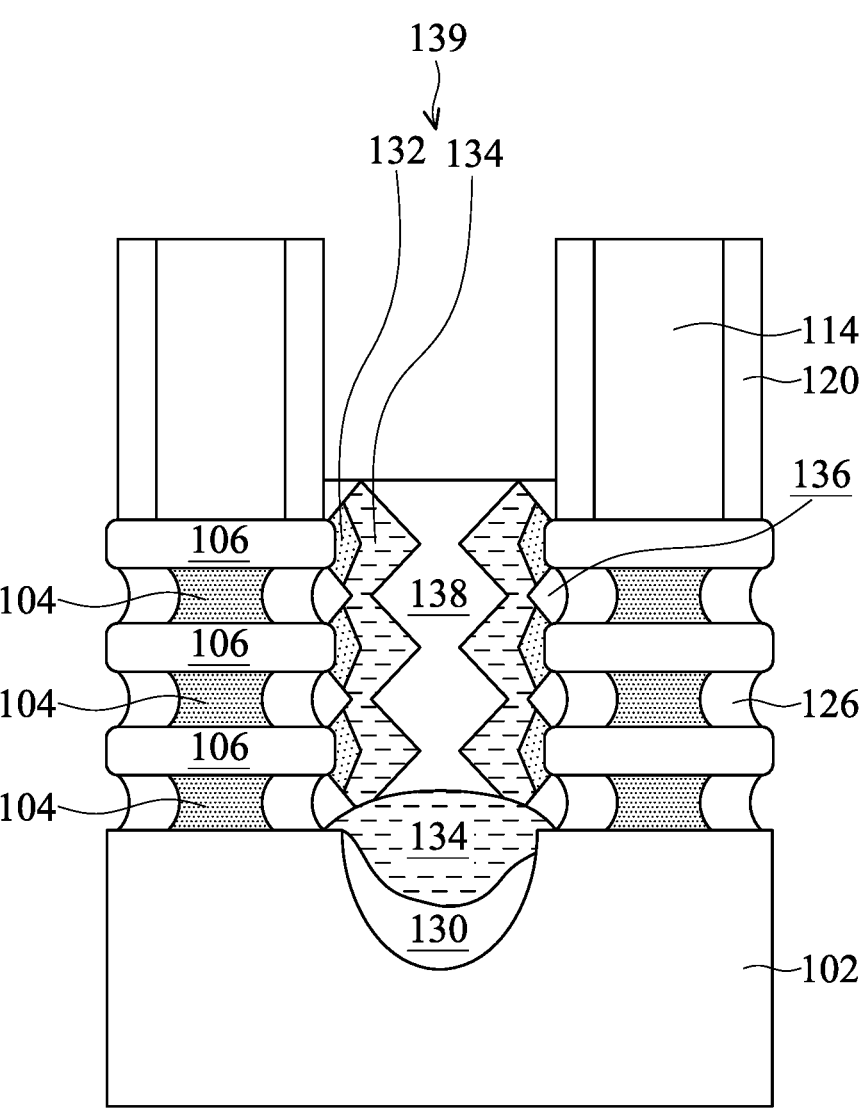

Next, a second epitaxial layer structure 138 is formed over the top surface and the sidewalls of the first epitaxial layer structures 134, as shown in FIG. 2G in accordance with some embodiments. In some embodiments, the second epitaxial layer structure 138 is formed over the un-doped layer structure 130 and fills up the source/drain opening 122 between the nanostructures 106. The processes for forming the second epitaxial layer structure 138 may be the same as, or similar to, those used to form the first epitaxial layer structures 134. For the purpose of brevity, the descriptions of these processes are not repeated herein. In some embodiments, the second epitaxial layer structure 138 is separate from the inner spacer 126.

The P-type second epitaxial layer structure 138 may include SiGe, and the N-type second epitaxial layer structure 138 may include SiP. In some embodiments, the dopant concentration of the P-type second epitaxial layer structure 138 is in a range of about 1E21 atoms/cm$^3$ to about 5E21 atoms/cm$^3$. In some embodiments, the dopant concentration of the N-type second epitaxial layer structure 138 is in a range of about 3E21 atoms/cm$^3$ to about 8E21 atoms/cm$^3$. If the dopant concentration is greater than 5E21 atoms/cm$^3$, the dopant may diffuse out, resulting in threshold voltage variation, increase of the short channel effect, and reduction of the carrier mobility. If the dopant concentration is smaller than 1E21 atoms/cm$^3$, it may be difficult to form a contact structure over the second epitaxial layer structure 138. In some embodiments, the dopant concentration of the second epitaxial layer structure 138 is greater than the dopant concentration of the first epitaxial layer structures 134. With higher dopant concentration of the second epitaxial layer structure 138, subsequently formed contact structure may be easier to form over the second epitaxial layer structure 138. In this way, dopant out-diffusion may be prevented and the resistance may be lowered. It may be easier to form a contact structure over the second epitaxial layer structure 138.

The un-doped layer structure 130, the pre-layer structure 132, the first epitaxial layer structures 134, and the second epitaxial layer structure 138 may be referred to as a source/drain epitaxial structure 139. In some embodiments, the air gap 136 is formed between the inner spacer 126 and the source/drain epitaxial structure 139. The air gap 136 may help to reduce dopant out-diffusing from the source/drain epitaxial structure 139. With extra dopant diffusing into the inner spacer 126, the threshold voltage may be changed. Since the amount of the extra dopant is not uniform, the threshold voltages of the devices may vary. In addition, the air gap 136 may help to reduce the parasitic capacitance. Therefore, the device performance may be improved.

It should be noted that, although in FIGS. 2A-2H only the source/drain epitaxial structure 139 over one side of the nanostructures 106 is shown, the source/drain epitaxial structures 139 are formed over opposite sides of the nanostructures 106. The source/drain epitaxial structures 139 over the other side of the nanostructures 106 are omitted in FIGS. 2A-2H for the purpose of brevity.

Figure 2H:
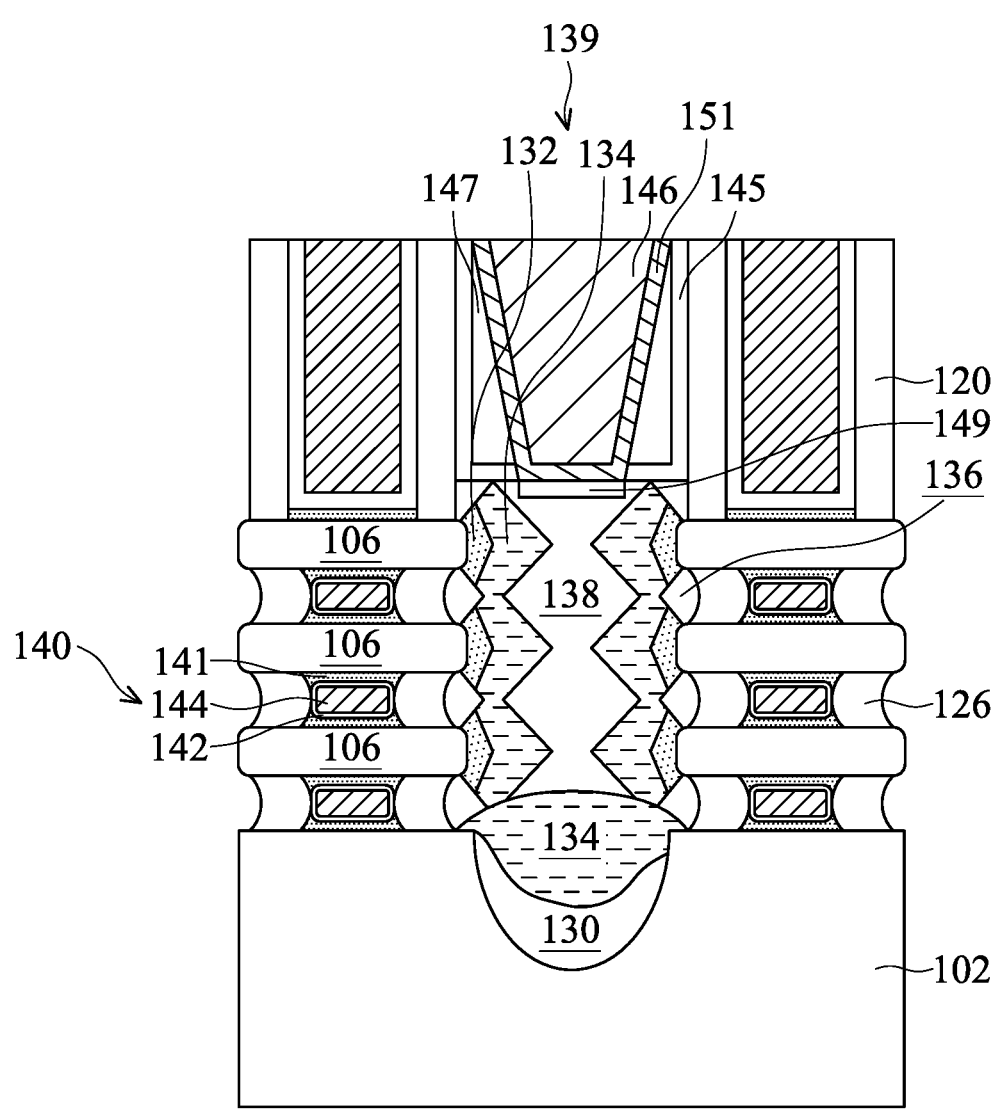

Next, an etch stop layer 145 is formed over the source/drain epitaxial structure 139, as shown in FIG. 2H in accordance with some embodiments. The etch stop layer 145 may include silicon nitride, silicon oxide, silicon oxynitride (SiON), other applicable materials, or a combination thereof. The etch stop layer 145 may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

After the etch stop layer 145 is formed, an inter-layer dielectric (ILD) structure 147 is formed over the etch stop layer 145, as shown in FIG. 2H in accordance with some embodiments. The ILD structure 147 may include multilayers made of multiple dielectric materials, such as silicon oxide (SiO$_x$, where x may be a positive integer), silicon oxycarbide (SiCO$_y$, where y may be a positive integer), silicon oxycarbonitride (SiNCO$_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 147 may be formed by chemical vapor deposition (CVD), spin-on coating, or other applicable processes.

Afterwards, a planarizing process is performed on the ILD structure 147 until the top surface of the dummy gate structure 114 is exposed (not shown). After the planarizing process, the top surface of the dummy gate structure 114 may be substantially level with the top surfaces of the spacer layers 120 and the ILD structure 147. The planarizing process may include a grinding process, a chemical mechanical polishing (CMP) process, an etching process, other applicable processes, or a combination thereof.

Next, the dummy gate structure 114 including the dummy gate dielectric layer 116 and a dummy gate electrode layer 118 is removed (not shown). Therefore, a trench is formed between the spacer layers 120 over the fin structure 108 and the second semiconductor layers 106 are exposed from the trench. The dummy gate structure 114 may be removed by a dry etching process or a wet etching process.

After the trenches are formed, the first semiconductor layers 104 are removed to form gaps (not shown). The removal process may include a selective etching process. The selective etching process may remove the first semiconductor layers 104 without substantially etching the second semiconductor layers 106. The selective removal of the first semiconductor layers 104 release the second semiconductor layers 106 as nanostructures 106 to serve as channel regions of the semiconductor device structure 10a, in accordance with some embodiments.

The selective etching process of removing the first semiconductor layers 104 may include a wet etch process, a dry etch process, or a combination thereof. The selective etching process may be a plasma-free dry chemical etching process. The etchant of the dry chemical etching process may include radicals such as HF, NF$_3$, NH$_3$, H$_2$, or a combination thereof.

After the gaps are formed, gate structures 140 are formed surrounding the nanostructure 106, as shown in FIG. 2H in accordance with some embodiments. The gate structure 140 surrounding the nanostructure 106 may enhance gate control ability. The gate structures 140 may be multi-layered structures. Each of the gate structures 140 may include an interfacial layer 141, a high-k dielectric layer 142, a work function layer 144, and a gate electrode layer (not shown). The nanostructure 106 may be surrounded and in direct contact with the interfacial layers 141, and the interfacial layers 141 may be surrounded by the high-k dielectric layers 142. In addition, the high-k dielectric layers 142 may be surrounded by the work function layer 144, and the work function layer 144 may be surrounded by the gate electrode layer.

The interfacial layers 141 may be made of silicon oxide, and the interfacial layers 141 may be formed by thermal oxidation. The high-k dielectric layer 142 may include dielectric material, such as HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other applicable high-k dielectric materials, or a combination thereof. The high-k dielectric layers 142 may be formed by using CVD, ALD, other applicable methods, or a combination thereof.

The work function layers 144 may be made of metal materials, and the metal materials may include N-work-function metal or P-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. The P-work-function metal may include titanium nitride (TiN), tungsten nitride (WN), tantalum nitride (TaN), ruthenium (Ru) or a combination thereof. The work function layers 144 may be formed by using CVD, ALD, other applicable methods, or a combination thereof.

The gate electrode layers may be made of one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another applicable material, or a combination thereof. The gate electrode layers may be formed by using CVD, ALD, electroplating, another applicable method, or a combination thereof.

Next, a metal semiconductor compound layer 149 may be formed over the source/drain epitaxial structure 139, as shown in FIG. 2H in accordance with some embodiments. The metal semiconductor compound layer 149 may reduce the contact resistance between the source/drain epitaxial structure 139 and the subsequently formed contact structure over the source/drain epitaxial structure 139. The metal semiconductor compound layer 149 may be made of titanium silicide (TiSi$_2$), nickel silicide (NiSi), cobalt silicide (CoSi), or other suitable low-resistance materials. The metal semiconductor compound layer 149 may be formed over the source/drain epitaxial structure 139 by forming a metal layer over the source/drain epitaxial structure 139 first. The metal layer may react with the source/drain epitaxial structure 139 in an annealing process and a metal semiconductor compound layer 149 may be produced. Afterwards, the unreacted metal layer may be removed in an etching process and the metal semiconductor compound layer 149 may be left.

Next, a barrier layer 151 may be conformally formed over the bottom surface and the sidewalls of the source/drain opening 122, as shown in FIG. 2H in accordance with some embodiments. Afterwards, the barrier layer 151 may be etched back. The barrier layer 151 remains over the bottom surface of the source/drain opening 122. The barrier layer 151 may be formed before filling the conductive material in the source/drain opening 122 to prevent the conductive material from diffusing out. The barrier layer 151 may also serve as an adhesive or glue layer. The material of the barrier layer 151 may be TiN, Ti, other applicable materials, or a combination thereof. The barrier layer 151 may be formed by depositing the barrier layer 151 materials by a physical vapor deposition process (PVD) (e.g., evaporation or sputtering), an atomic layer deposition process (ALD), an electroplating process, other applicable processes, or a combination thereof.

Afterwards, a contact structure 146 is formed into the source/drain opening 122 over the source/drain epitaxial structure 139, as shown in FIG. 2H in accordance with some embodiments. The contact structure 146 may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The contact structure 146 may be formed by a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the contact structure 146, and then a planarization process such as a chemical mechanical polishing (CMP) process or an etch back process is optionally performed to remove excess conductive materials. After the planarization process, the top surface of the contact structure 146 may be level with the top surface of gate structure 140 and the spacer layers 120.

With an air gap 136 formed between the source/drain epitaxial structure 139 and the inner spacers 126, the dopant out-diffusion from the source/drain epitaxial structure 139 to the inner spacer 126 may be reduced. The air gap 136 may block the dopant. The threshold voltage may be affected by the dopant out-diffusion from the source/drain epitaxial structure 139. Therefore, the short channel effect of may be improved and the mobility may be enhanced. In addition, the capacitance may be lowered due to the low k-value of the air gap 136. The device performance such as the speed and the power consumption may be improved.

Figure 3A:
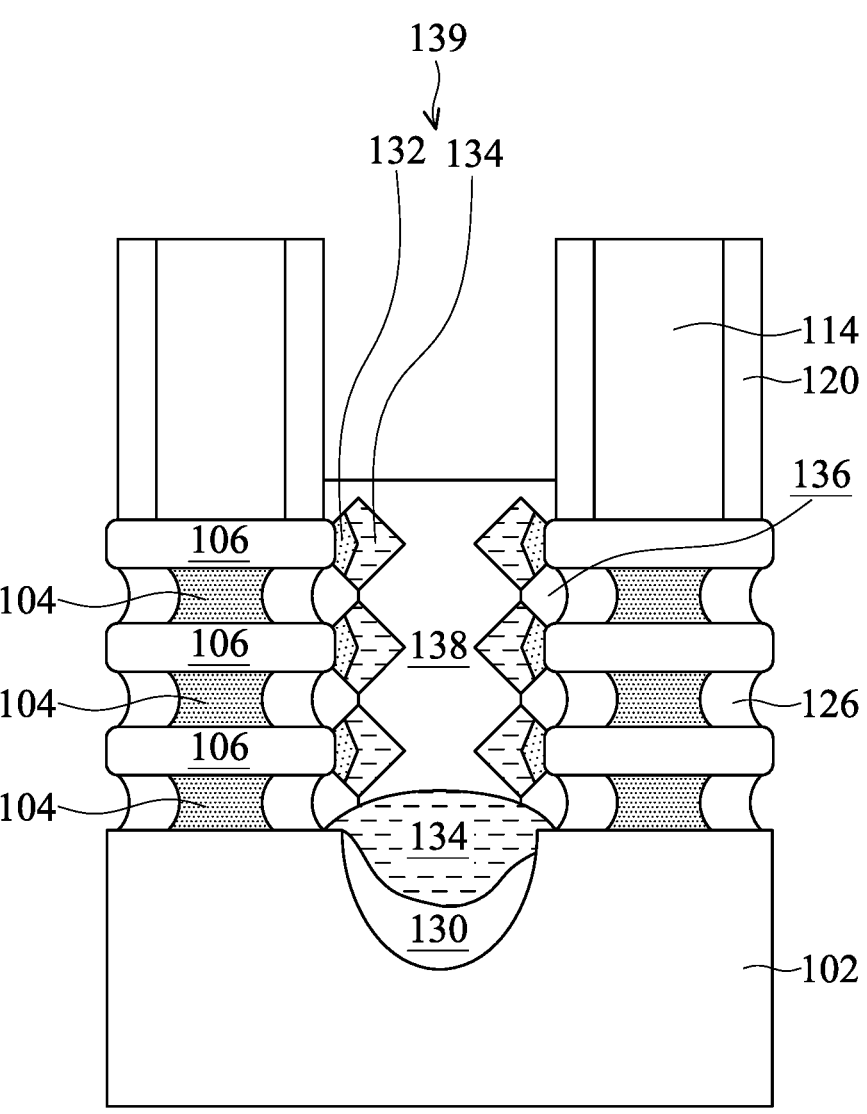
FIGS. 3A-3B are cross-sectional representations of vari-ous stages of forming a semiconductor device structure, in accordance with some embodiments of the disclosure.
Figure 3B:
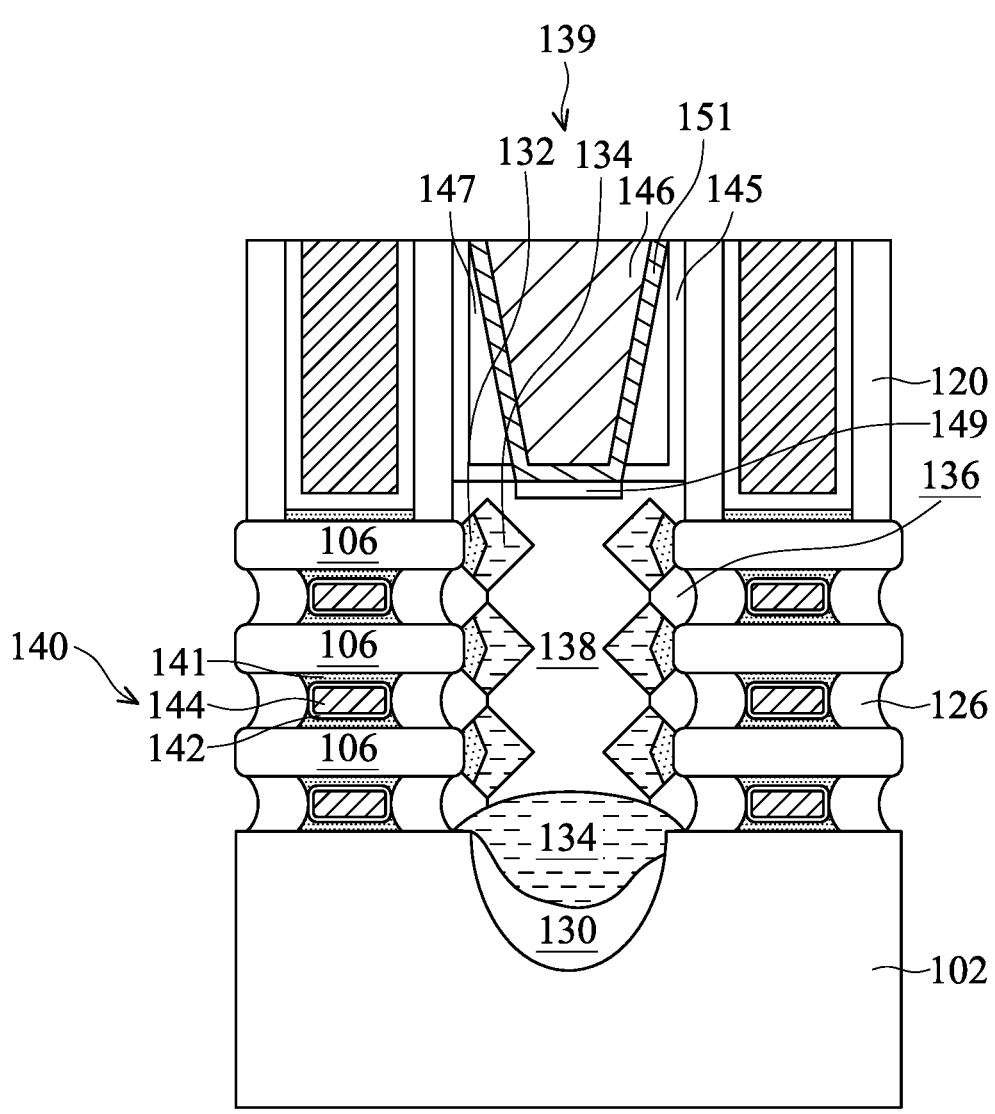

Many variations and/or modifications may be made to the embodiments of the disclosure. The first epitaxial layer structure 134 may not be merged while the air gap 136 remains. FIGS. 3A-3B are cross-sectional representations of various stages of forming a semiconductor device structure 10b, in accordance with some embodiments of the disclosure.

In some embodiments, the first epitaxial layer structure 134 are not merged and are separate from each other. After the second epitaxial layer structure 138 is formed, an air gap 136 may be sealed and may be formed between the inner spacer 126 and the second epitaxial layer structure 138. Therefore, the air gap 136 may help to reduce the amount of dopant that is out-diffused from the source/drain epitaxial structure 139. In some embodiments, the inner spacers 126, the pre-layer structure 132, the first epitaxial layer structure 134, and the second epitaxial layer structure 138 are exposed in the air gap 136.

Next, the gate structure 140 including an interfacial layer 141, the high-k dielectric layer 142, and the work function layer 144 is formed surrounding the nanostructures 106, as shown in FIG. 3B in accordance with some embodiments. The contact structure 146 may be formed over the source/drain epitaxial structure 139. The processes and materials for forming the gate structure 140 and the contact structure 146 may be the same as, or similar to, those used to form the gate structure 140 and the contact structure 146 in the previous embodiments. For the purpose of brevity, the descriptions of these processes are not repeated herein.

With an air gap 136 formed between the source/drain epitaxial structure 139 and the inner spacers 126, the dopant out-diffusion from the source/drain epitaxial structure 139 may be reduced. The short channel effect of may be improved and the mobility may be enhanced. In addition, the capacitance may be lowered due to the low k-value of the air gap 136. The device performance such as the speed and the power consumption may be improved. The first epitaxial layer structures 134 may be separate from each other and the air gap 136 may be sealed by the second epitaxial layer structure 138. The air gap 136 may be greater than the air gap 136 in the embodiments as shown in FIG. 2H.

Many variations and/or modifications may be made to the embodiments of the disclosure. The pre-layer structures 132 may have rounded sidewalls while the first epitaxial layer structures 134 still have diamond shapes. FIGS. 4A-4D are cross-sectional representations of various stages of forming a semiconductor device structure 10c, in accordance with some embodiments of the disclosure.

In some embodiments, the etching duration is in a range of about 20 seconds to about 30 seconds in each cycle. The deposition and etching temperature is in a range of about 600° C. to about 700° C. In some embodiments, with less etching duration and lower etching temperature of forming the pre-layer structure 132, the pre-layer structure 132 may have rounded sidewalls. For example, the lateral etching of the cyclical deposition and etching process is less than the lateral etching in the previous embodiments. Therefore, there may be no sharp corners at the sidewalls of the pre-layer structure 132 and the pre-layer structure 132 may have a U-shape sidewall. With pre-layer structure 132 having rounded sidewall, the subsequently formed first epitaxial layer structures 134 may be merged earlier, and it may be easier to form the air gap 136. There may be less defects and the yield may be improved.

Figure 4A:
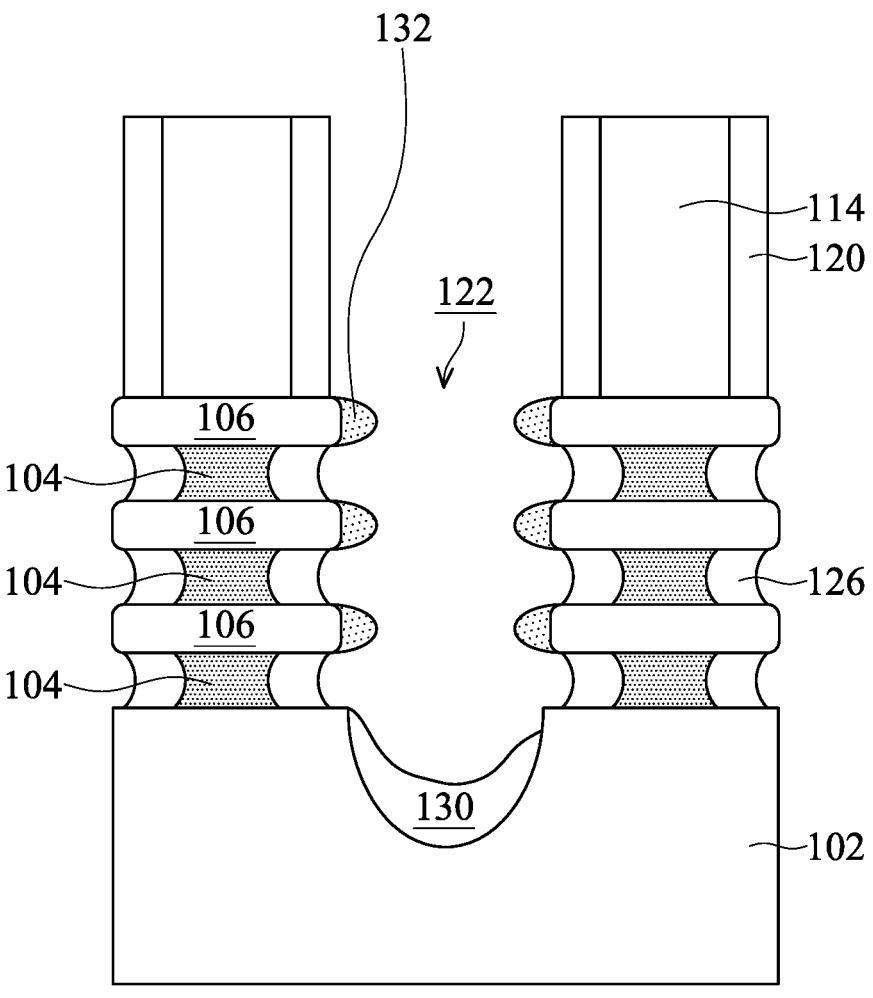
FIGS. 4A-4D are cross-sectional representations of vari-ous stages of forming a semiconductor device structure, in accordance with some embodiments of the disclosure.
Figure 4B:
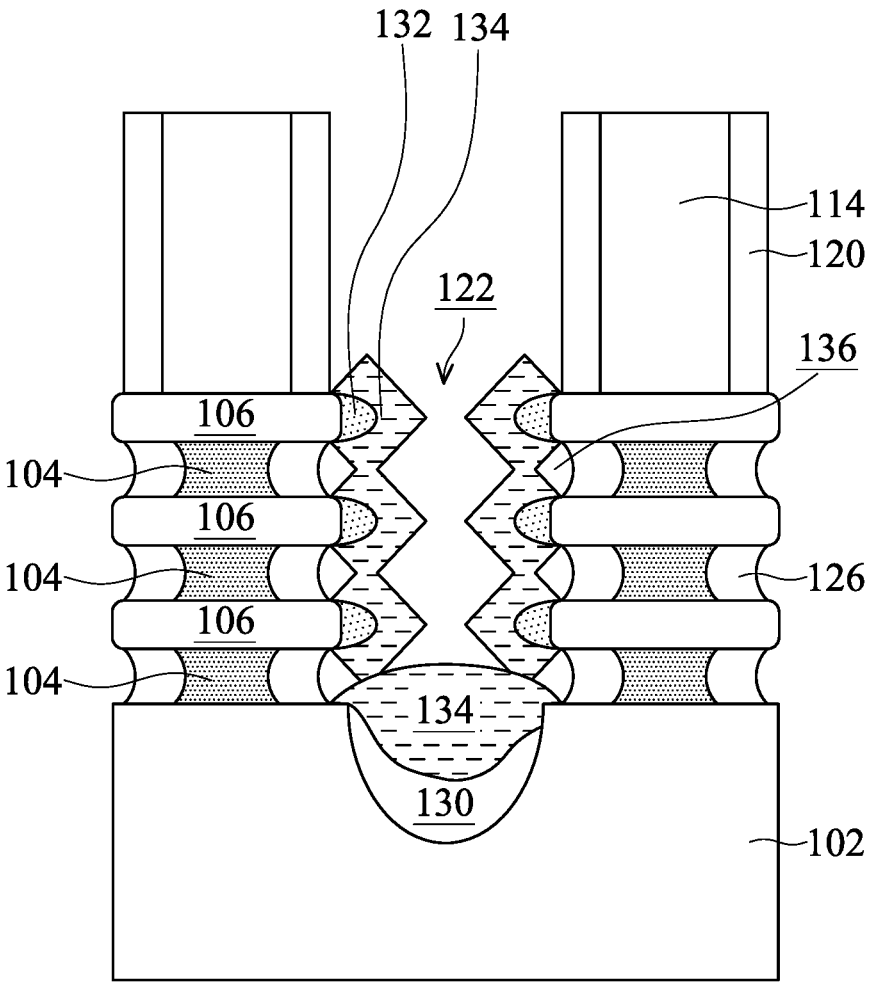

Later, the first epitaxial layer structures 134 are formed over sidewalls of the pre-layer structures 132 with rounded sidewalls, as shown in FIG. 4B in accordance with some embodiments. The epitaxy growth rate of growing the first epitaxial layer structure 134 in the vertical direction and the horizontal direction may be different, and first epitaxial layer structure 134 may have a diamond shape. In some embodiments, adjacent first epitaxial layer structures 134 may merge, and an air gap 136 is formed between the inner spacer 126 and the first epitaxial layer structures 134.

Figure 4C:
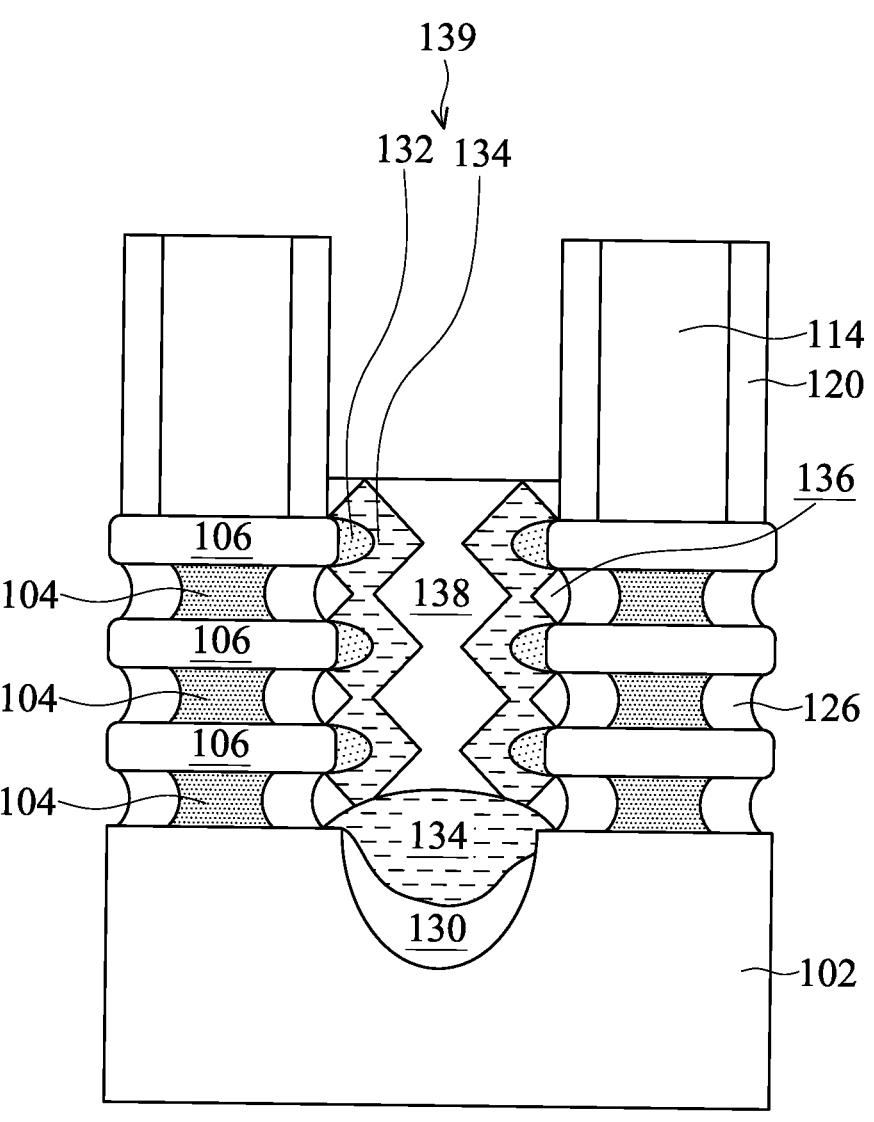

Next, the second epitaxial layer structure 138 is formed over the top surface and the sidewalls of the first epitaxial layer structures 134, as shown in FIG. 4C in accordance with some embodiments. The processes and materials for forming the second epitaxial layer structure 138 may be the same as, or similar to, those used to form the second epitaxial layer structure 138 in the previous embodiments. For the purpose of brevity, the descriptions of these processes are not repeated herein.

Figure 4D:
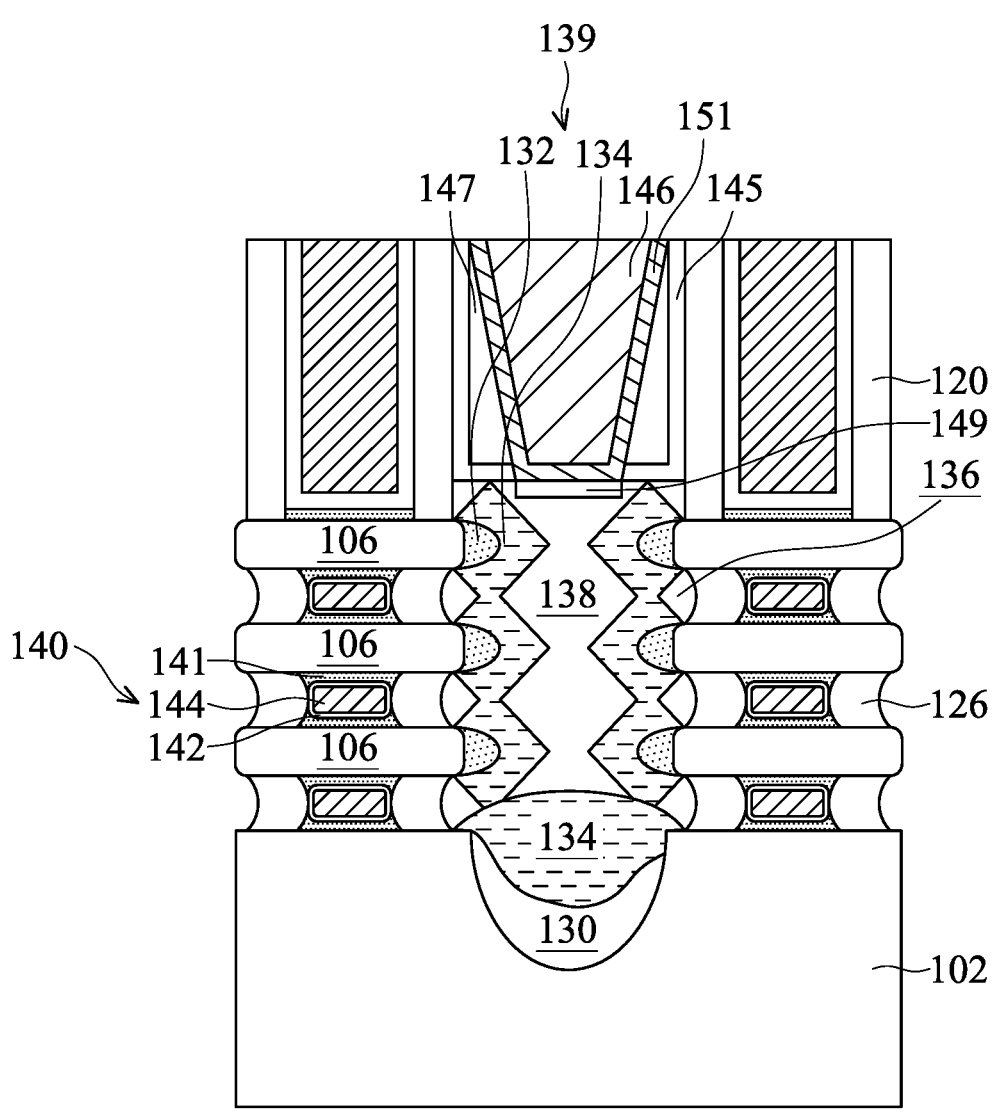

Next, the gate structure 140 including an interfacial layer 141, the high-k dielectric layer 142, and the work function layer 144 is formed surrounding the nanostructures 106, as shown in FIG. 4D in accordance with some embodiments. The contact structure 146 may be formed over the source/drain epitaxial structure 139. The processes and materials for forming the gate structure 140 and the contact structure 146 may be the same as, or similar to, those used to form the gate structure 140 and the contact structure 146 in the previous embodiments. For the purpose of brevity, the descriptions of these processes are not repeated herein.

With an air gap 136 formed between the source/drain epitaxial structure 139 and the inner spacers 126, the dopant out-diffusion from the source/drain epitaxial structure 139 may be reduced. The short channel effect of may be improved and the mobility may be enhanced. In addition, the capacitance may be lowered due to the low k-value of the air gap 136. The device performance such as the speed and the power consumption may be improved. The pre-layer structure 132 may have a rounded sidewall while the first epitaxial layer structures 134 have a diamond shape. The air gap 136 may be smaller than the air gap 136 in the embodiments shown in FIG. 2H. It may be easier to form the air gap 136 with pre-layer structure 132 having rounded sidewall. There may be less defects and the yield may be improved.

Figure 5A:
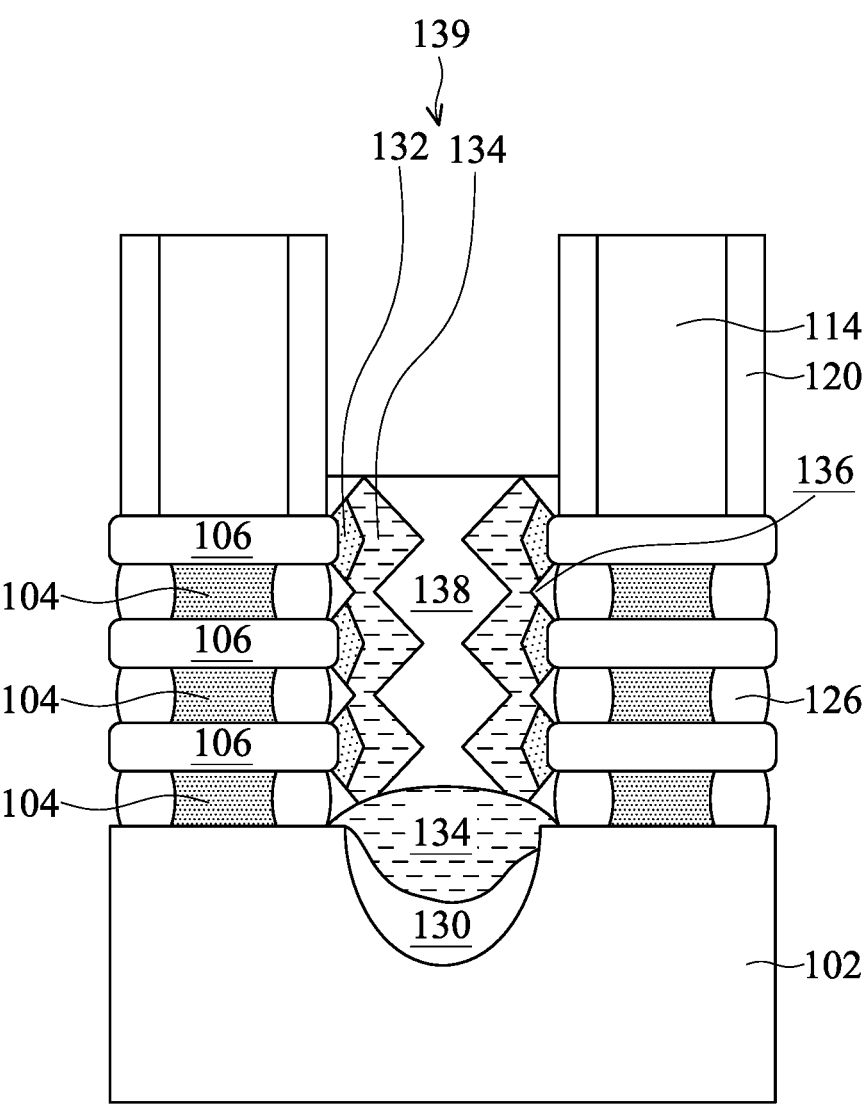
FIGS. 5A-5B are cross-sectional representations of vari-ous stages of forming a semiconductor device structure, in accordance with some embodiments of the disclosure.
Figure 5B:
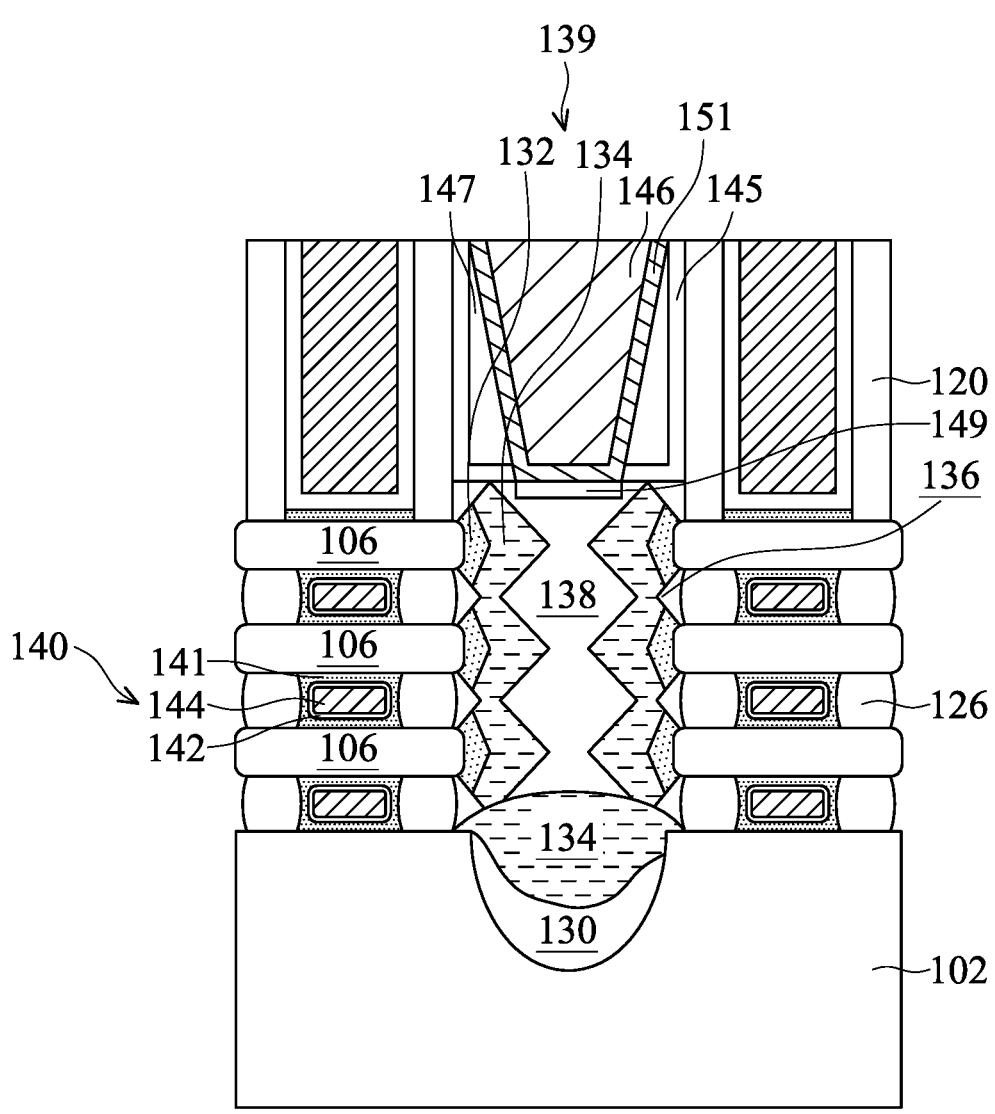

Many variations and/or modifications may be made to the embodiments of the disclosure. The inner spacer 126 may have a convex sidewall. FIGS. 5A-5B are cross-sectional representations of various stages of forming a semiconductor device structure 10d, in accordance with some embodiments of the disclosure.

In some embodiments, since the inner spacer 126 is partially trimmed, the inner spacer 126 may have a convex sidewall. An air gap 136 is formed between the inner spacers 126 and the source/drain epitaxial structure 139. The air gap 136 may help to reduce the amount of dopant that is out-diffused from the source/drain epitaxial structure 139.

Next, the gate structure 140 including an interfacial layer 141, the high-k dielectric layer 142, and the work function layer 144 is formed surrounding the nanostructures 106, as shown in FIG. 5B in accordance with some embodiments. The contact structure 146 may be formed over the source/drain epitaxial structure 139. The processes and materials for forming the gate structure 140 and the contact structure 146 may be the same as, or similar to, those used to form the gate structure 140 and the contact structure 146 in the previous embodiments. For the purpose of brevity, the descriptions of these processes are not repeated herein.

With an air gap 136 formed between the source/drain epitaxial structure 139 and the inner spacers 126, the dopant that diffuses out from the source/drain epitaxial structure 139 may be reduced. The short channel effect of may be improved and the mobility may be enhanced. In addition, the capacitance may be lowered due to the low k-value of the air gap 136. The device performance such as the speed and the power consumption may be improved. The size of the air gap 136 may be modified by the inner spacer 126 trimming process, so that the capacitance may meet the design demand.

Figure 6A:
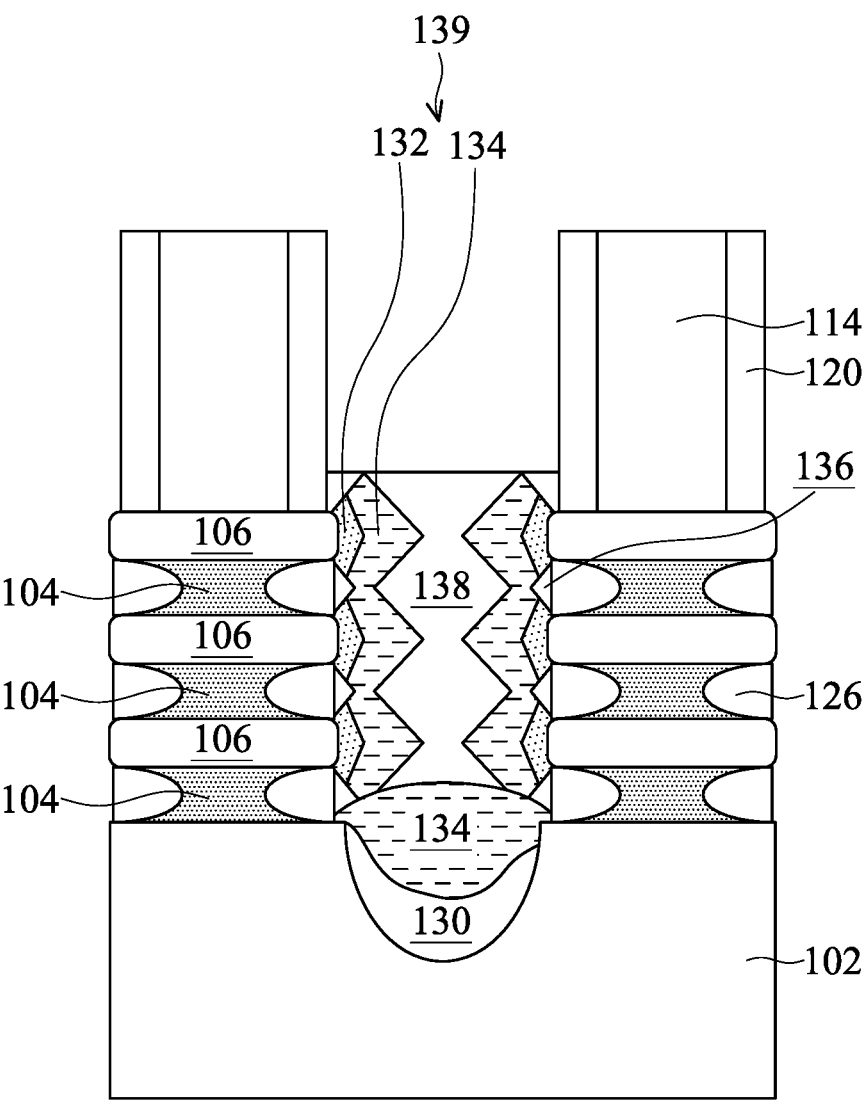
FIGS. 6A-6B are cross-sectional representations of vari-ous stages of forming a semiconductor device structure, in accordance with some embodiments of the disclosure.
Figure 6B:
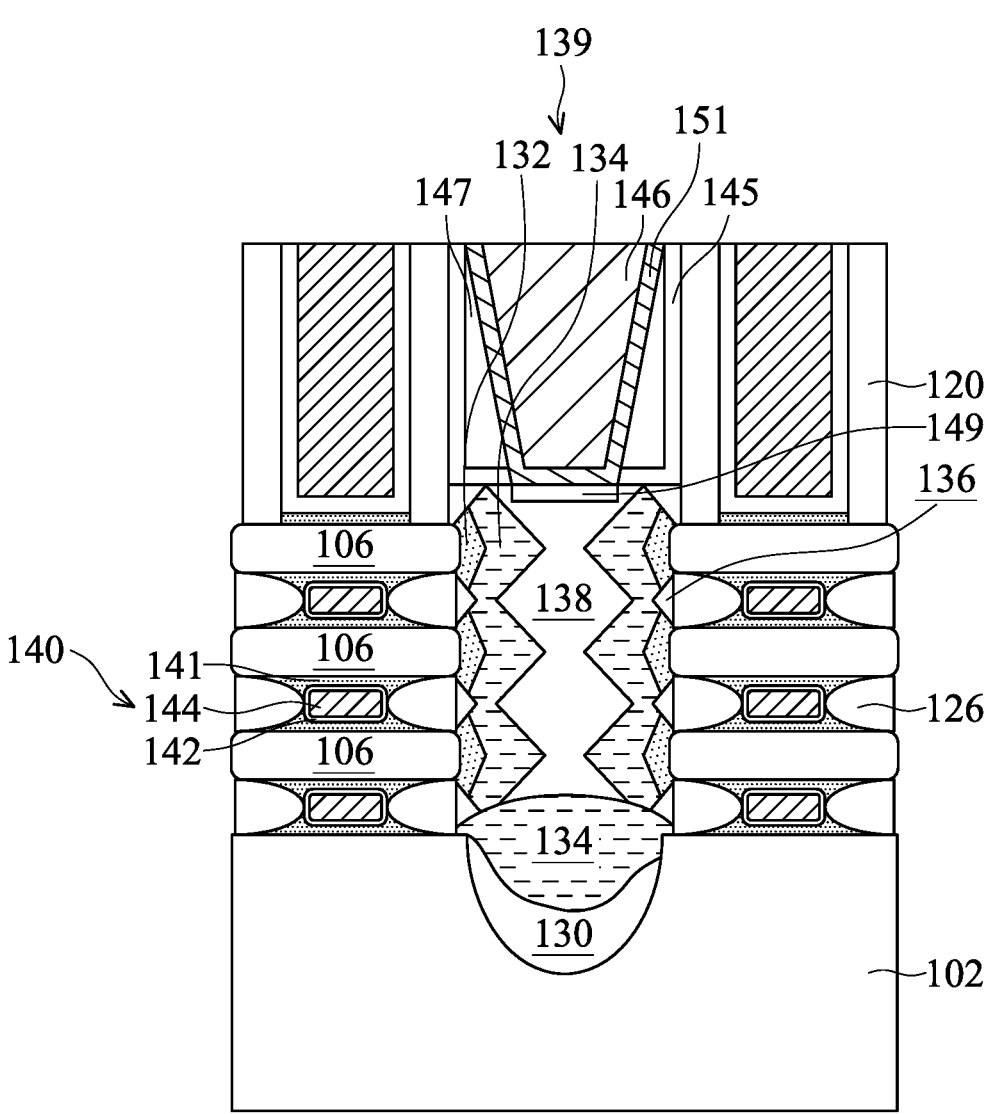

Many variations and/or modifications may be made to the embodiments of the disclosure. The inner spacer 126 may be partially trimmed and has a flat sidewall aligning with the sidewall of the nanostructures 106. FIGS. 6A-6B are cross-sectional representations of various stages of forming a semiconductor device structure 10e, in accordance with some embodiments of the disclosure.

In some embodiments, since the inner spacer 126 is partially trimmed, the sidewalls of the inner spacers 126 are vertically aligned with the sidewalls of the nanostructures 106, and an air gap 136 is formed between the inner spacers 126 and the source/drain epitaxial structure 139. The air gap 136 may help to reduce the dopant that is out-diffused from the source/drain epitaxial structure 139.

Next, the gate structure 140 including an interfacial layer 141, the high-k dielectric layer 142, and the work function layer 144 is formed surrounding the nanostructures 106, as shown in FIG. 6B in accordance with some embodiments. The contact structure 146 may be formed over the source/drain epitaxial structure 139. The processes and materials for forming the gate structure 140 and the contact structure 146 may be the same as, or similar to, those used to form the gate structure 140 and the contact structure 146 in the previous embodiments. For the purpose of brevity, the descriptions of these processes are not repeated herein.

With an air gap 136 formed between the source/drain epitaxial structure 139 and the inner spacers 126, the dopant that is out-diffused from the source/drain epitaxial structure 139 may be reduced. The short channel effect of may be improved and the mobility may be enhanced. In addition, the capacitance may be lowered due to the low k-value of the air gap 136. The device performance such as the speed and the power consumption may be improved. The inner spacer 126 may be partially trimmed and has a substantially flat sidewall vertically aligning with the sidewall of the nanostructures 106. The size of the air gap 136 may be modified by the inner spacer 126 trimming process, so that the capacitance may meet the design demand.

As described previously, an air gap 136 is formed between the inner spacer 126 and the source/drain epitaxial structure 139. By forming a pre-layer structure 132 over sidewalls of the nanostructures 106, adjacent first epitaxial layer structures 134 having a diamond shape may be merged, and the air gap 136 may be formed between the inner spacer 126 and the first epitaxial layer structures 134. In some embodiments as shown in FIG. 3A, the adjacent first epitaxial layer structures 134 are not merged, and the air gap 136 is sealed by the second epitaxial layer structure 138. In some embodiments as shown in FIG. 4A, the pre-layer structure 132 has a rounded sidewall. In some embodiments as shown in FIG. 5A, the inner spacers 126 has a convex sidewall. In some embodiments as shown in FIG. 6A, the inner spacers 126 are partially trimmed and has a flat sidewall surface.

Embodiments of a semiconductor device structure and a method for forming the same are provided. The method for forming the semiconductor device structure may include forming an air gap between the inner spacer and the source/drain epitaxial structure. With the air gap, device performance and power consumption may be improved.

In some embodiments, a semiconductor device structure is provided. The semiconductor device structure includes nanostructures formed over a substrate. The semiconductor device structure further includes a gate structure surrounding the nanostructures. The semiconductor device structure further includes inner spacers formed over opposite sides of the gate structure. The semiconductor device structure further includes source/drain epitaxial structures formed over opposite sides of the nanostructures. An air gap is formed between the inner spacers and the source/drain epitaxial structures.

In some embodiments, a semiconductor device structure is provided. The semiconductor device structure includes a fin structure formed over a substrate. The semiconductor device structure further includes nanostructures formed over the fin structure. The semiconductor device structure further includes a gate structure wrapped around the nanostructures. The semiconductor device structure further includes inner spacers sandwiched between the nanostructures. The semiconductor device structure further includes pre-layer structures formed over sidewalls of the nanostructures. The semiconductor device structure further includes first epitaxial layer structures covering sidewalls of the pre-layer structures. An air gap is formed between adjacent pre-layer structures.

In some embodiments, a method for forming a semiconductor device structure is provided. The method for forming a semiconductor device structure includes forming a fin structure with alternating stacked first semiconductor layers and second semiconductor layers over a substrate. The method for forming a semiconductor device structure also includes forming a dummy gate structure across the fin structure. The method for forming a semiconductor device structure also includes forming source/drain openings in the fin structure beside the dummy gate structure. The method for forming a semiconductor device structure also includes laterally etching the first semiconductor layers from the source/drain openings. The method for forming a semiconductor device structure also includes depositing inner spacers over sidewalls of the first semiconductor layers. The method for forming a semiconductor device structure also includes forming pre-layer structures over sidewalls of the second semiconductor layers. The method for forming a semiconductor device structure also includes forming first epitaxial layer structures over sidewalls of the pre-layer structure. The method for forming a semiconductor device structure also includes forming a second epitaxial layer structure in the source/drain openings. The method for forming a semiconductor device structure also includes removing the dummy gate structure and the first semiconductor layers to form a gate opening between the second semiconductor layers. The method for forming a semiconductor device structure also includes forming a gate structure in the gate opening surrounding the second semiconductor layers. A lateral epitaxy rate of forming the first epitaxial layer structures is greater than a vertical epitaxy rate of forming the first epitaxial layer structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
nanostructures formed over a substrate;
a gate structure surrounding each of the nanostructures;
inner spacers adjacent the gate structure and interleaving the nanostructures; and
a source/drain epitaxial structure in direct contact with sidewalls of the nanostructures,
wherein the source/drain epitaxial structure comprises:
a bottom epitaxial feature interfacing the substrate,
epitaxial features interfacing the sidewalls of the nanostructures,
a first epitaxial layer interfacing a top surface of the bottom epitaxial feature and the epitaxial features, and
a second epitaxial layer over the first epitaxial layer,
wherein the epitaxial features are doped,
wherein the bottom epitaxial feature comprises undoped silicon or undoped silicon germanium,
wherein an air gap is formed between one of the inner spacers and the source/drain epitaxial structure,
wherein the air gap is spaced apart from the second epitaxial layer.

2. The semiconductor device structure as claimed in claim 1,
wherein each of the epitaxial features has a diamond shape.

3. The semiconductor device structure as claimed in claim 1,
wherein the epitaxial features and the first epitaxial layer comprise a dopant,
wherein a dopant concentration of the first epitaxial layer is greater than a dopant concentration of the epitaxial features,
wherein the epitaxial features are separate from each other.

4. The semiconductor device structure as claimed in claim 1, wherein the inner spacers have convex sidewalls facing the source/drain epitaxial structure.

5. The semiconductor device structure as claimed in claim 1, wherein the first epitaxial layer comprises a bottom portion disposed directly on the bottom epitaxial feature and a sidewall portion interfacing the epitaxial features, wherein the second epitaxial layer is spaced apart from the epitaxial features, and the bottom epitaxial feature by the first epitaxial layer.

6. The semiconductor device structure as claimed in claim 1, wherein the epitaxial features comprise silicon germanium.

7. The semiconductor device structure as claimed in claim 1, wherein the epitaxial features and the first epitaxial layer are exposed in the air gap.

8. A semiconductor device structure, comprising:

nanostructures disposed over a substrate;

a gate structure wrapping around each of the nanostructures;

inner spacers vertically interleaving the nanostructures;

an un-doped epitaxial layer disposed on the substrate; and a source/drain epitaxial structure comprising:

a pre-layer in direct contact with sidewalls of the nanostructures, a first epitaxial layer in direct contact with the pre-layer and the un-doped epitaxial layer, and a second epitaxial layer in direct contact with the first epitaxial layer and spaced apart from the substrate by the first epitaxial layer and the un-doped epitaxial layer, wherein air gaps are horizontally disposed between inner spacers and the source/drain epitaxial structure, wherein a portion of each of the air gaps extends vertically between two adjacent ones of the nanostructures, wherein a composition of the un-doped epitaxial layer is different from a composition of the pre-layer, wherein the first epitaxial layer and the pre-layer are exposed in the air gaps, wherein the second epitaxial layer is spaced apart from the air gaps.

9. The semiconductor device structure of claim 8, wherein the un-doped epitaxial layer comprises undoped silicon, wherein the pre-layer comprises silicon germanium.

10. The semiconductor device structure of claim 8, wherein the pre-layer comprises a diamond shape.

11. The semiconductor device structure of claim 8, wherein a portion of the first epitaxial layer in contact with the pre-layer also comprises a diamond shape.

12. The semiconductor device structure of claim 8, wherein the pre-layer, the first epitaxial layer and the second epitaxial layer comprise a dopant, wherein a concentration of the dopant in the second epitaxial layer is greater than a concentration of the dopant in the first epitaxial layer, wherein the concentration of the dopant in the first epitaxial layer is greater than a concentration of the dopant in the pre-layer, wherein the un-doped epitaxial layer is free of dopant.

13. A semiconductor device structure, comprising:

nanostructures disposed over a substrate;

a gate structure wrapping around each of the nanostructures;

inner spacers vertically interleaving the nanostructures; and a source/drain epitaxial structure in direct contact with sidewalls of the nanostructures, wherein air gaps are horizontally disposed between inner spacers and the source/drain epitaxial structure, wherein the source/drain epitaxial structure comprises:

an un-doped epitaxial layer interfacing the substrate, a pre-layer interfacing the sidewalls of the nanostructures, a first epitaxial layer in direct contact with the un-doped epitaxial layer and the pre-layer, and a second epitaxial layer in direct contact with the first epitaxial layer and spaced apart from the un-doped epitaxial layer, wherein a portion of each of the air gaps extends vertically between two adjacent ones of the nanostructures, wherein the pre-layer and the first epitaxial layer are exposed in the air gaps wherein the second epitaxial layer is spaced apart from the air gaps.

14. The semiconductor device structure of claim 13, wherein a composition of the un-doped epitaxial layer is different from a composition of the pre-layer.

15. The semiconductor device structure of claim 13, wherein the pre-layer comprises a diamond shape.

16. The semiconductor device structure of claim 13, wherein a portion of the first epitaxial layer in contact with the pre-layer also comprises a diamond shape.

17. The semiconductor device structure of claim 8, wherein the pre-layer and the first epitaxial layer are exposed in the air gaps.

18. The semiconductor device structure of claim 13, wherein the un-doped epitaxial layer comprises silicon and is not doped, wherein the pre-layer comprises silicon germanium and is doped.

19. The semiconductor device structure of claim 8, wherein the second epitaxial layer interfaces the pre-layer, wherein the second epitaxial layer is spaced apart from the un-doped epitaxial layer.

20. The semiconductor device structure of claim 8, wherein an interface between the first epitaxial layer and the un-doped epitaxial layer is free of the pre-layer.

* * * * *